United States Patent
Chun

Patent Number: 5,923,080
Date of Patent: Jul. 13, 1999

[54] SEMICONDUCTOR APPARATUS HAVING A LEADFRAME WITH COATED LEADS

[75] Inventor: Heung Sup Chun, Choongchungbook-Do, Rep. of Korea

[73] Assignee: LG Semicon Co., Ltd., Choongchungbuk-Do, Rep. of Korea

[21] Appl. No.: 08/960,081

[22] Filed: Oct. 24, 1997

Related U.S. Application Data

[63] Continuation of application No. 08/631,153, Apr. 12, 1996, abandoned.

[30] Foreign Application Priority Data

Oct. 19, 1995 [KR] Rep. of Korea ............ 95/36165

[51] Int. Cl.⁶ .................................................. H01L 23/495
[52] U.S. Cl. .......................... 257/666; 257/669; 257/670; 257/734
[58] Field of Search ................. 257/666, 669, 257/670, 671, 691, 690, 734, 735, 736, 69, 798

[56] References Cited

U.S. PATENT DOCUMENTS

| | | | |
|---|---|---|---|
| 4,731,282 | 3/1988 | Tsukagoshi et al. | 428/220 |
| 4,740,657 | 4/1988 | Tsukagoshi et al. | 174/88 R |
| 5,051,813 | 9/1991 | Schneider et al. | 257/666 |
| 5,120,665 | 6/1992 | Tsukagoshi et al. | 437/8 |
| 5,176,366 | 1/1993 | Masumoto et al. | 257/667 |
| 5,412,157 | 5/1995 | Yagoura et al. | 257/666 |
| 5,530,282 | 6/1996 | Tsuji | 257/666 |

*Primary Examiner*—Carl Whitehead, Jr.
*Attorney, Agent, or Firm*—Morgan, Lewis & Bockius LLP

[57] ABSTRACT

A semiconductor apparatus having an insulation coating section at an outer section of an outer lead so as to reduce the number of inferior products at the time of bonding a fine pitch outer lead, which includes an insulation coating section formed at an outer portion of an outer lead of a TAB tape so as to prevent electric short between outer leads which occurs due to a conduction ball contained in ACA/ACF during a TAB outer lead bonding.

6 Claims, 2 Drawing Sheets

SEMICONDUCTOR APPARATUS HAVING A LEADFRAME WITH COATED LEADS

This application is a continuation of application Ser. No. 08/631,153, filed Apr. 12, 1996, now abandoned.

BACKGROUND OF THE INVENTION

1. Field of the Invention

The present invention relates to a semiconductor apparatus, and particularly to an improved semiconductor apparatus having an insulation coating section at an outer section of an outer lead so as to reduce the number of inferior products which occurs at the time of bonding a fine pitch outer lead.

2. Description of the Conventional Art

Generally, a tape automated bonding (TAB) is related to a surface real mounting type package technique which is directed to bonding a large scale integrated circuit (LSI) using a metal bump to a tape on which a metal pattern is formed. That is, it is related to an interconnection technique for directly bonding the LSI and a lead frame. Compared with a conventional wire bonding method, the TAB technique is one of advanced interconnection techniques.

Thesedays, leading companies in the industry are trying to develop the bump formation technique because it is one of key technologies in the industry.

The bump in the TAB plays a function of wire of the wiring bonding method. The bump is formed as a metallic protrusion capable of electrically connecting the pad of the LSI chip and the lead frame of the TAB. Here, the bump is classified into Au bump and Sn/Pb bump in accordance with its material, and is classified into a mushroom type bump and a straight wall type bump.

The bump bonding technique, which is one of key technologies in the industry, is classified into the following three fabrication methods in accordance with a bump formation method.

1) The lead frame accessing method—the lead bumping method and a transferred bumping method.
2) The wafer level accessing method—the wire bumping method.
3) The chip level accessing method—the wire bumping method.

Meanwhile, the above-mentioned methods has the following disadvantages, respectively.

1) The lead frame accessing method: This method uses a common wafer, and is adaptable to fabricate various kinds of the products and small amount of the same; however, the bumped lead tape is costly.
2) The wafer bumping method: It is adaptable to fabricate various kinds of the products and small amount of the same; however, TAB process is additionally necessary according to the wafer bumping, and accuracy rate is decreased.
3) The wire bumping method: It is adaptable to fabricate a small size pin product; however, it is not adaptable to fabricate a small size multi-pin product.

The products made in TAB process is transferred to a set-maker, and it is mounted on the substrate.

FIG. 1 shows an interconnection after an outer lead bonding of a conventional semiconductor apparatus.

As shown in FIG. 1, spaced-apart bonding pads 2 are formed on the upper portion of the substrate 1. In addition, the TAB tape includes outer leads 5 on which metallic pattern is formed in cooperation with an adhesive 4 on a certain portion of the insulation tape 3. The outer leads 5 of the TAB and the substrate 1 are adhered by a heterogenous adhesive such as an anisotropic conductive adhesive (ACA) or an anisotropic conductive film (ACF) by controlling pressure and temperature.

Meanwhile, conductive balls 6 are inserted between the outer leads 5 and the bonding pads 2. In addition, conductive balls 6a irrespective of the conductive balls 6 are inserted between the outer leads 5. However, as the semiconductor product becomes multi-functional and has a high performance and a multi-pin structure, the pad/lead pitch of the product becomes finesse.

Since the conventional semiconductor apparatus have the conductive balls 6a which is irrespective of the conductive balls 6 adopted for electrical interconnection, electric short-circuit between corresponding elements occurs.

SUMMARY OF THE INVENTION

Accordingly, it is an object of the present invention to provide a semiconductor apparatus, which overcome the problems encountered in a conventional semiconductor apparatus.

It is another object of the present invention to provide an improved semiconductor apparatus having an insulation coating section at an outer section of an outer lead so as to reduce the number of inferior products which occurs at the time of bonding a fine pitch outer lead.

To achieve the above objects, there is provided a semiconductor apparatus, which includes an insulation coating section formed at an outer portion of an outer lead of a TAB tape so as to prevent electric short-circuit between outer leads which occurs due to a conduction ball contained in ACA/ACF during a TAB outer lead bonding.

DETAILED DESCRIPTION OF THE INVENTION

Figure 1:
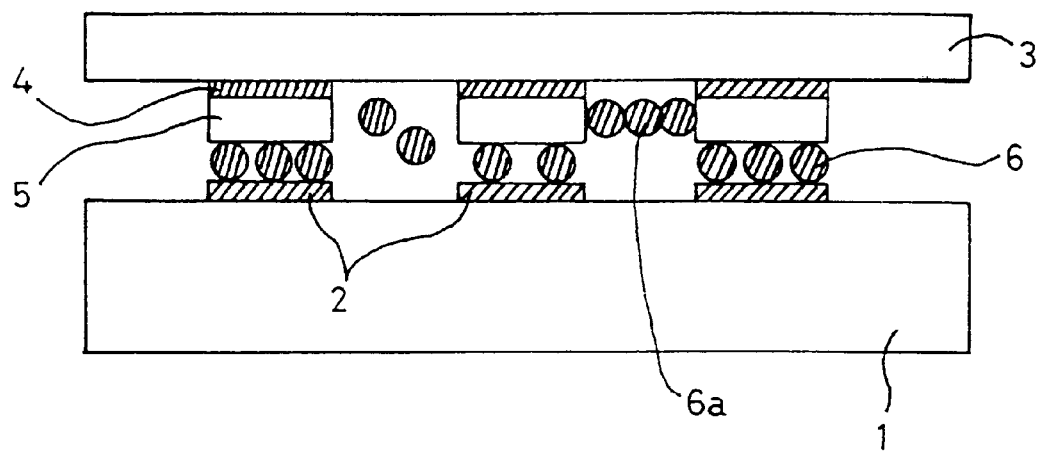
FIG. 1 is a cross-sectional view of a conventional semiconductor package so as to show an interconnection after an outer lead bonding.
Figure 2:
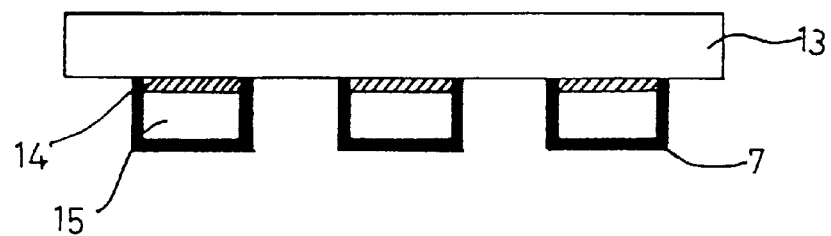
FIG. 2 is a cross-sectional view of a semiconductor package so showing an insulation coated TAB tape according to the present invention.

FIG. 2 shows an insulation coated TAB tape according to the present invention.

To begin with, since the general TAB process is similar to the admitted prior art, the detailed description will be omitted, and only the structure of the TAB tape will now be explained.

As shown in FIG. 2, the outer leads 15 are attached to the lower portion of the insulation tape 13 with an adhesive 14. However, an insulation coating section 7 is formed at the outer surface of the outer lead so as to prevent electric short-circuit. The insulation coating section is formed with epoxy group material. In addition, the thickness of the insulation coating section 7 is preferably below 1000 Å.

Figure 3:
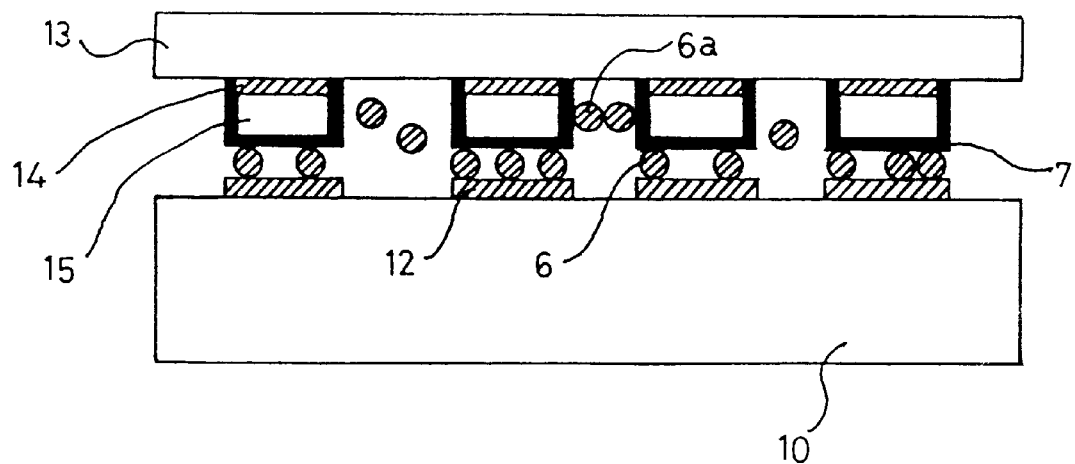
FIG. 3 is a cross-sectional view of a semiconductor package so showing an interconnection which connects a TAB insulation tape to a substrate after an outer lead bonding according to the present invention.

FIG. 3 shows an interconnection between the TAB tape insulation and the substrate after the outer lead bonding.

As shown herein, during the outer lead bonding process, in the insulation coating section formed at an outer periphery of the outer lead 15, the conductive ball 6 contained in the ACA/ACF and the conductive ball 6a which is irrespective of the above-mentioned conductive ball 6 come into contact with each other. At this time, the conductive ball 6 and the outer lead 15 having the insulation coating section 7 become electrically conductive because the insulation coating section 7 of the outer lead 15 is destroyed due to a high pressure.

Here, in FIG. 3, voltage is applied to the conductive ball 6 and the pad 12 through the outer lead 15, or voltage is applied to the conductive ball 6 and the outer lead 15 from the pad 12.

As described above, the semiconductor apparatus is directed to forming an insulation coating surrounding the outer lead so as to prevent electric short-circuit between leads which occurs due to the conductive ball which is irrespective of the electric conduction as distance between outer leads become closer according to the fine pitch product developed in the industry.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A tape automated bonding (TAB) tape in a semiconductor device, comprising:

an insulation tape;

a plurality of outer leads attached to a lower portion of the insulation tape; and an insulation coating section formed at outer surfaces of the plurality of outer leads, the insulation coating section having a predetermined thickness so as to leave spaces between adjacent ones of the plurality of outer leads including the insulation coating section thereon.

2. The TAB tape as claimed in claim 1, wherein the insulation coating section includes epoxy group material.

3. The TAB tape as claimed in claim 1, wherein the insulation coating section has a thickness of below 1000 Å.

4. An interconnection between an insulation tape and a substrate having a plurality of bonding pads, comprising:

a plurality of outer leads attached to a lower portion of the insulation tape;

an insulation coating section formed at outer surfaces of the plurality of outer leads, the insulation coating section having a predetermined thickness so as to leave spaces between adjacent ones of the plurality of outer leads including the insulation coating section thereon, the insulation coating section preventing electric short-circuit between the plurality of outer leads; and wherein the plurality of bonding pads are connected electrically to the plurality of outer leads through conductive balls contained in an anisotropic conductive adhesive or an anisotropic conductive film.

5. The interconnection as claimed in claim 4, wherein the insulation coating section includes epoxy group material.

6. The interconnection as claimed in claim 4, wherein the insulation coating section has a thickness of below 1000 Å.

* * * * *